United States Patent [19]
Padrun

[11] Patent Number: 5,365,653
[45] Date of Patent: Nov. 22, 1994

[54] TOOL FOR INSERTING/REMOVING INTEGRATED CIRCUIT CHIPS

[76] Inventor: John Padrun, 2123-C Bering Dr., San Jose, Calif. 95131

[21] Appl. No.: 100,974

[22] Filed: Aug. 3, 1993

[51] Int. Cl.5 .............................................. H05K 3/30
[52] U.S. Cl. ........................................ 29/741; 29/764
[58] Field of Search ............... 29/741, 739, 764, 758, 29/837–839

[56] References Cited

U.S. PATENT DOCUMENTS

| | | |
|---|---|---|
| 4,583,287 | 4/1986 | McDevitt et al. ................ 29/764 X |
| 4,866,838 | 9/1989 | Porter ................ 29/764 X |
| 4,879,806 | 11/1989 | Feng ................ 29/764 X |
| 5,062,201 | 11/1991 | Long, Jr. ................ 29/764 X |

*Primary Examiner*—Carl E. Hall
*Attorney, Agent, or Firm*—Flehr, Hohbach, Test, Albritton & Herbert

[57] ABSTRACT

Tool inserting an electronic component such as a microprocessor or other integrated circuit into and removing the same from a socket on a circuit board or the like. The tool has a reversible presser foot slidably mounted between a pair of side plates and adapted to be driven by a drive screw. The presser foot has a drive surface on one side thereof for engagement with an upper drive surface of the component and a pair of feet on an opposite side thereof for engagement with an upper surface of the circuit board. Hooks at the lower ends of the side plates are selectively engagable with either an under surface of the socket or an under surface of the component. The component is pressed into the socket by rotation of the drive screw with the hooks engaging the lower surface of the socket and the drive surface of the foot pressing against the upper surface of the component, and it is removed by rotation of the drive screw with the hooks engaging the lower surface of the component and the feet of the presser foot bearing against the circuit board.

5 Claims, 3 Drawing Sheets

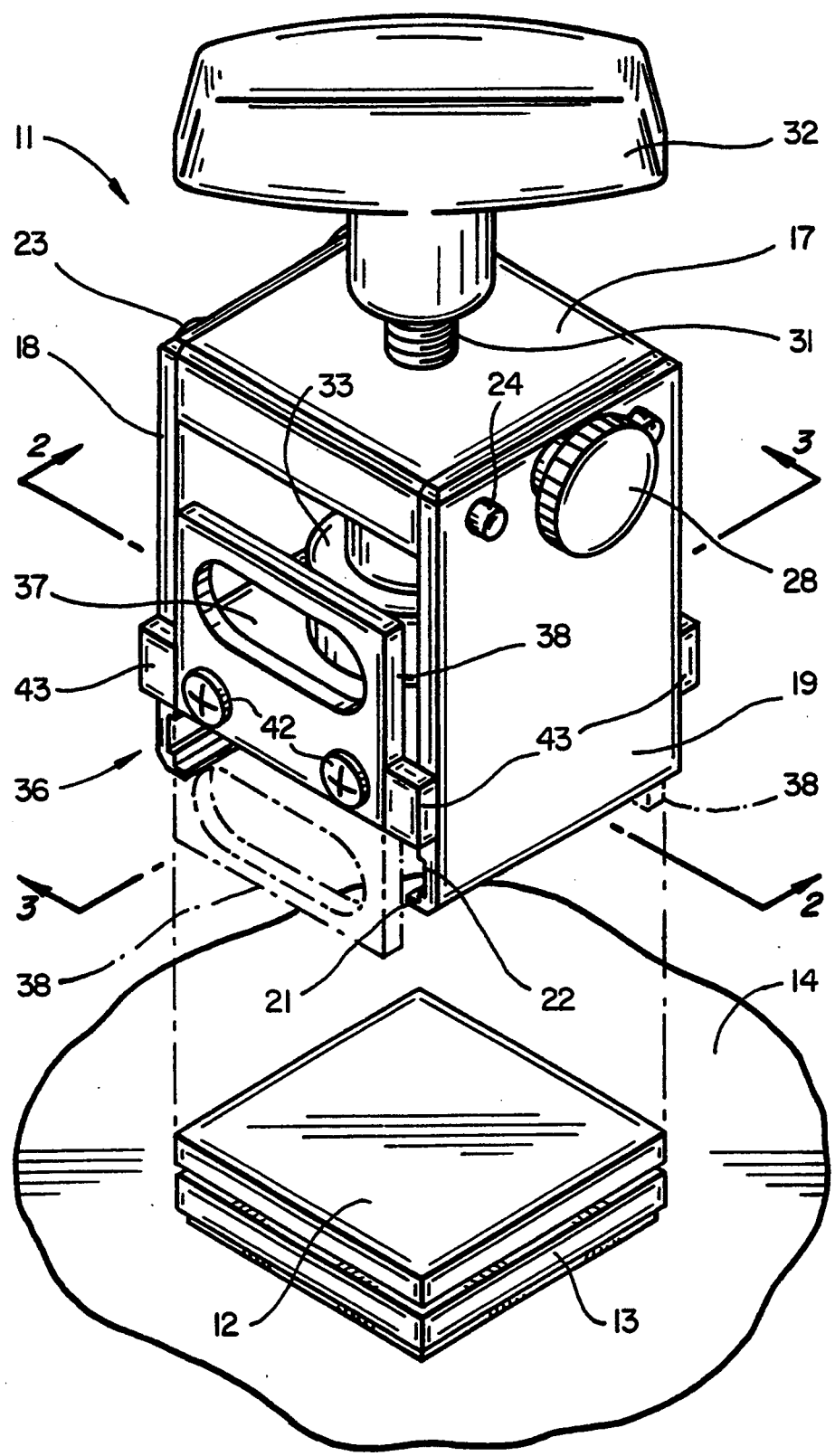
FIG_1

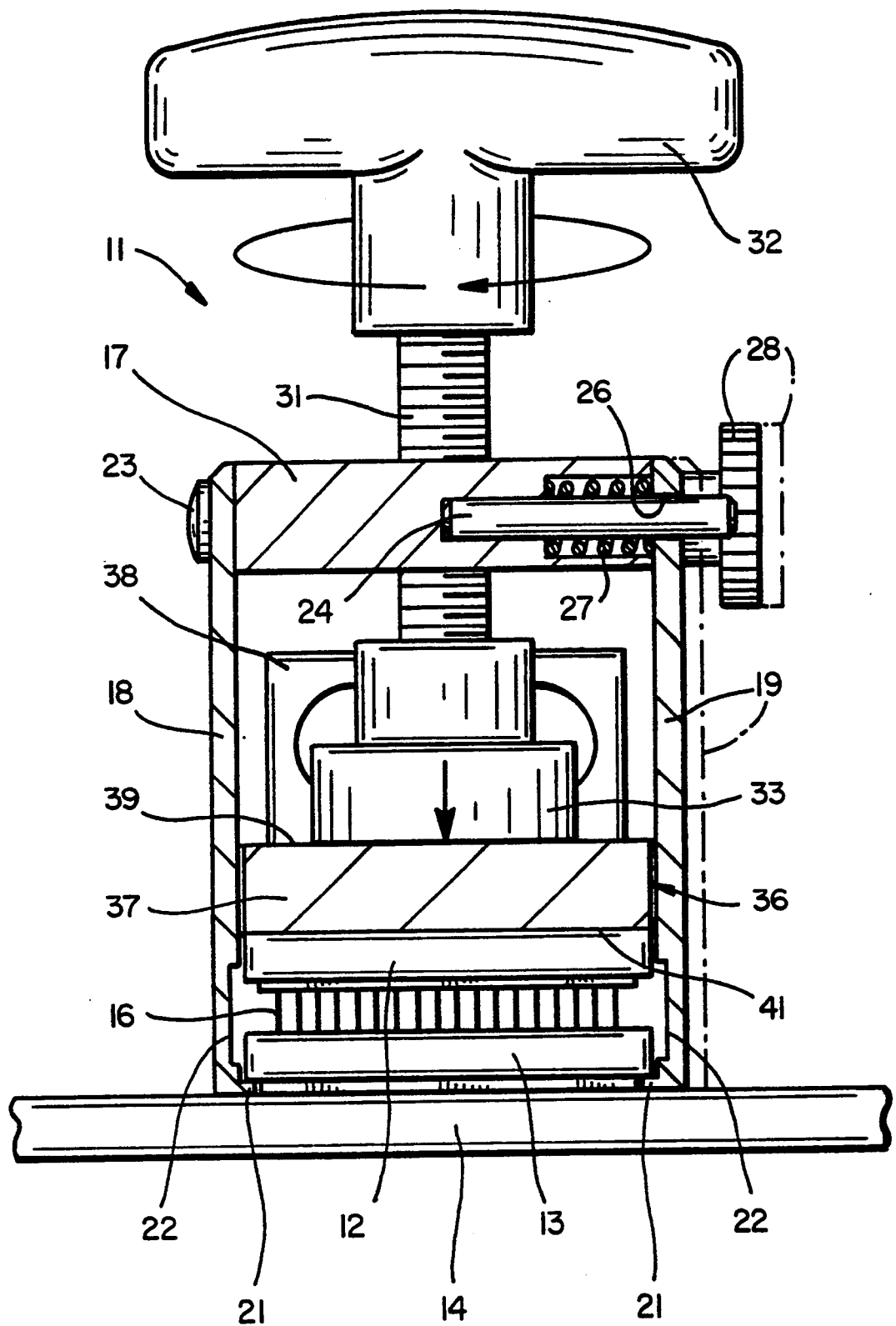
FIG_2

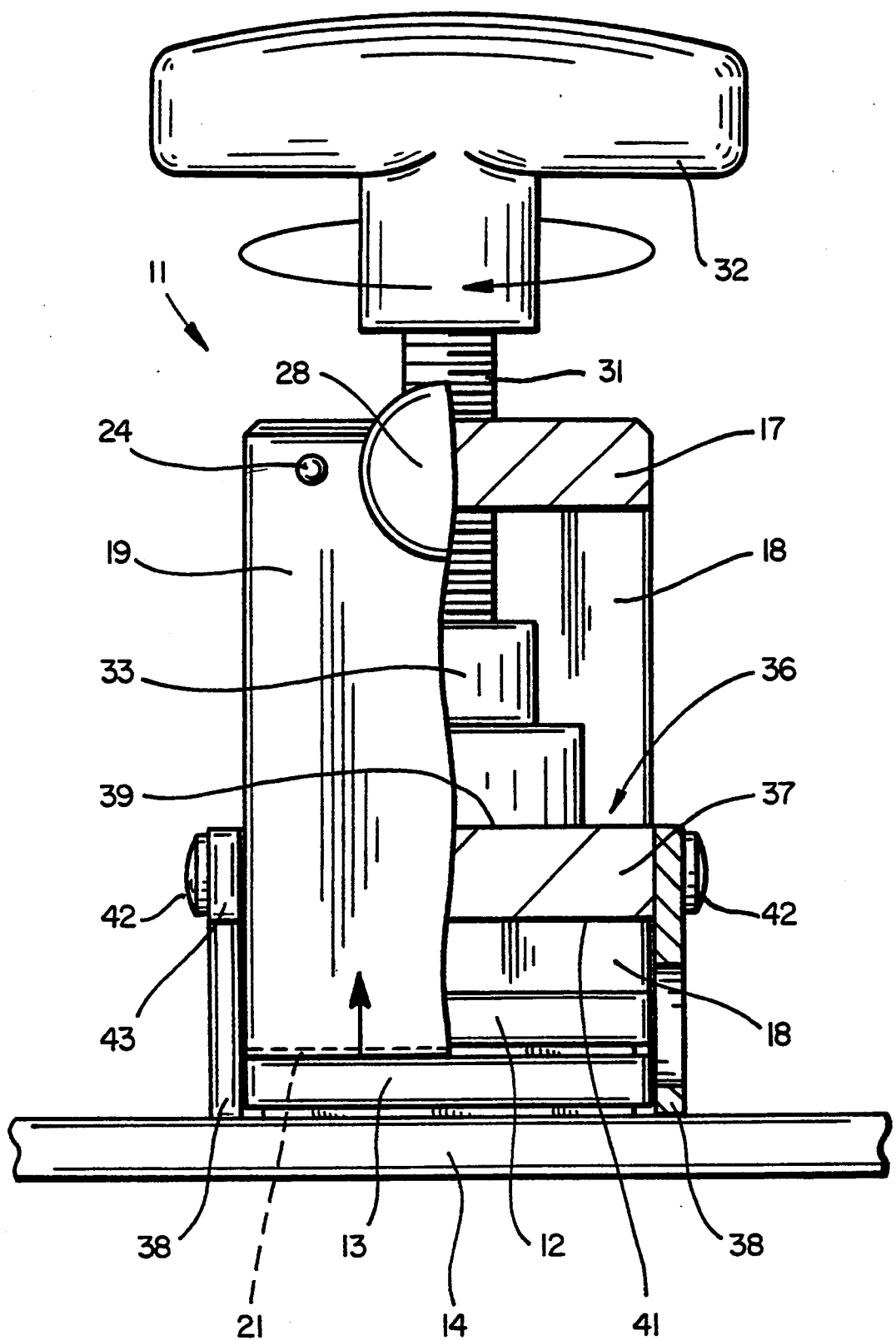
FIG_3

TOOL FOR INSERTING/REMOVING INTEGRATED CIRCUIT CHIPS

This invention pertains generally to tools for use on computers and other electronic equipment and, more particularly, to a tool for inserting and removing integrated circuit chips.

Electronic components such as microprocessors and other integrated circuit chips are commonly supplied in packages with arrays of contact pins, sometimes known as pin grid arrays, which are received in sockets on circuit boards and the like. The pins tend to be rather fragile, and particularly with microprocessors and other packages having relatively large numbers of pins, it is difficult to insert and remove the chips without bending or breaking the pins.

Heretofore, there have been some efforts to provide tools for use in the insertion and removal of microprocessors and other integrated circuits. One Example of such a tool is found in U.S. Pat. No. 4,583,287, and others have been available commercially from various sources. These tools tend to be unduly complex and cumbersome to use, and they do not work as well as might be expected.

It is in general an object of the invention to provide a new and improved tool for use in the insertion and removal of electronic components such as microprocessors and other integrated circuits.

Another object of the invention is to provide a tool of the above character which overcomes the limitations and disadvantages of the prior art.

These and other objects are achieved in accordance with the invention by providing a tool having a base, a pair of side plates depending from opposite sides of the base, a drive screw threadedly mounted in the base, a reversible presser foot slidably mounted between the side plates and adapted to be driven in a downward direction away from the base by the drive screw. The presser foot has a drive surface on one side thereof for engagement with an upper drive surface of the component and a pair of feet on an opposite side thereof for engagement with an upper surface of the circuit board. Inwardly facing hooks at the lower ends of the side plates are selectively engagable with either an under surface of the socket or an under surface of the component. The component is pressed into the socket by rotation of the drive screw with the hooks engaging the lower surface of the socket and the drive surface of the foot pressing against the upper surface of the component. It is removed by rotation of the drive screw with the hooks engaging the lower surface of the component and the feet of the presser foot bearing against the circuit board.

FIG. 1 is an isometric view of one embodiment of an insertion and extraction tool according to the invention.

FIG. 2 is a cross-sectional view taken along line 2—2 in FIG. 1, showing the tool in an operative position for inserting an integrated circuit in a socket.

FIG. 3 is a cross-sectional view taken along line 3—3 in FIG. 1, showing the tool in an operative position for extracting an integrated circuit from a socket.

In the drawings, the tool 11 is illustrated in conjunction with an integrated circuit 12 mounted in a socket 13 on a circuit board 14. The integrated circuit has a microprocessor or other chip mounted in a relatively flat, generally rectangular housing or package with an array of contact pins 16 projecting from the lower side thereof.

The tool includes a relatively thick, horizontally extending base plate 17 which is square or rectangular with lateral dimensions corresponding to those of the chip package to be inserted or removed. A pair of rigid side plates 18, 19 depend from the base plate and have inwardly facing hooks 21 extending along the lower edges thereof for engagement with under surfaces of the chip package and socket. Relieved areas 22 are formed in the inner faces of the side plates immediately above the hooks to accommodate the edge portions of the chip package in the event of any slight misalignment with the socket.

Plate 18 is rigidly affixed to the base by screws 23, and plate 19 is mounted in a manner which permits it to be selectively affixed to the base plate or released for lateral movement. In this regard, plate 19 is mounted on a pair of guide pins 24 which project laterally from the base and pass through openings 26 in the side plate, with coil springs 27 disposed coaxially about the guide pins urging the side plate away from the base plate, as indicated in broken lines in FIG. 2. A thumbscrew with an operating knob 28 is threaded into the side of the base and bears against the outer surface of the side plate for moving the side plate toward the base.

A drive screw 31 is threadedly mounted in the base and extends in a direction parallel to the side plates. The drive screw has an operating knob or handle 32 at its upper end and an enlarged portion 33 with a flat lower surface at its lower end.

A presser foot 36 is slidably mounted between the side plates for movement in a downward direction in response to rotation of the drive screw. The presser foot consists of a rectangular body 37 with a pair of feet in the form of parallel rectangular plates 38 projecting from one side thereof. The body has planar surfaces 39, 41 on the upper and lower sides thereof, with surface 39 having lateral dimensions approximately the same as those of the chip package. The presser foot is reversible and can be positioned with the foot plates extending either in an upward direction or in a downward direction. The foot plates are rigidly affixed to base plate 37 by screws 42 and are separated by a distance slightly greater than the lateral dimension of the socket for the chip to be installed and/or removed with the tool, so they can straddle the socket and engage the upper surface of the circuit board. Body 37 is formed with ears 43 at the corners which engage the side edges of side plates 18, 19 and serve as guides to retain the foot in proper alignment between the side plates.

The tool is fabricated of rigid materials and is sized in accordance with the dimensions of the integrated circuit to be inserted or removed. As noted above, the lateral dimensions of base plate 17 are approximately the same as those of the chip package, and the spacing between foot plates 38 is slightly greater than the lateral dimensions of the chip package and socket. In one presently preferred embodiment, base plate 12, side plates 18, 19, body 37 and foot plates 38 are all are made of aluminum and anodized, with the side plates and the foot plates each having a thickness on the order of $\frac{1}{8}$ inch.

The tool is made from precision machined parts and is more substantial and has superior operating characteristics because of this construction. Base plate 17 is machined to be precisely square, with dimensions corresponding closely to the chip to be inserted or removed.

Side plates 18, 19 extend precisely at right angles from the base, and hooks 21 are the same distance from and precisely parallel to the base. The base plate of presser foot 36 is likewise machined to precise dimensions, with foot plates 38 perpendicular to it and the lower edges of the foot plates precisely parallel with hooks 21 and base 17. The squareness of the tool is assured by placing the lower edges of side plates 18, 19 on a flat surface, with screws 42 slightly loose, and turning drive screw 31 to bring the lower edges of foot plates 38 squarely against the flat surface, at which point the screws are tightened. This alignment is important from the standpoint of applying an even pressure to the integrated circuit and preventing it from being cracked during insertion and removal.

Because of the rigid nature and precise dimensions of the tool, hooks 21 do not have to extend as far under the chip and socket as the hooks of prior art inserters/extractors in order to get a good grip. This means that the hooks do not have to be notched to clear pins near the edges of the chip, so that the tool can be used with any pin grid array and is not limited to a single pin spacing or arrangement as are the tools of the prior art.

Operation and use of the tool is as follows. To install an integrated circuit, as illustrated in FIG. 2, presser foot 36 is oriented with foot plates 38 pointing in an upward direction, and the lower end of drive screw bearing against surface 39 of the foot body. The chip package is positioned on the socket, with the contact pins on the chip starting into the socket. Thumbscrew 28 is loosened, and the tool is positioned over the chip and socket, with the upper surface of the chip package facing the drive surface 41 of the presser foot and the hooks at the lower ends of the side plates positioned between the circuit board and the under surface of the socket. Thumbscrew 28 is then tightened to draw side plate 19 rigidly against base 17, and drive screw 31 is turned to push the integrated circuit in a downward direction into the socket.

To remove the integrated circuit from the socket, as illustrated in FIG. 3, presser foot 36 is oriented with foot plates 38 pointing in a downward direction, straddling the socket and bearing against the upper surface of the circuit board. Hooks 21 are positioned beneath the under surface of the chip package, and when the drive screw is rotated, the foot plates press against the circuit board and the hooks pull the against chip package, drawing the pins out of the socket.

It is apparent from the foregoing that a new and improved tool for inserting and removing integrated circuit chips has been provided. While only one presently preferred embodiment has been described in detail, as will be apparent to those familiar with the art, certain changes and modifications can be made without departing from the scope of the invention as defined by the following claims.

I claim:

1. In a tool for inserting an electronic component into and removing an electronic component from a socket on a circuit board: a base, a pair of side plates depending from opposite sides of the base, a drive screw threadedly mounted in the base, a reversible presser foot slidably mounted between the side plates and adapted to be driven in a downward direction away from the base by the drive screw, said presser foot having a drive surface on one side thereof for engagement with an upper drive surface of the component and a pair of feet on an opposite side thereof for engagement with an upper surface of the circuit board, and inwardly facing hooks at the lower ends of the side plates selectively engagable with either an under surface of the socket or an under surface of the component so that the component can be pressed into the socket by rotation of the drive screw with the hooks engaging the lower surface of the socket and the drive surface of the foot pressing against the upper surface of the component, and the component can be pulled from the socket by rotation of the drive screw with the hooks engaging the lower surface of the component and the feet of the presser foot bearing against the circuit board.

2. The tool of claim 1 wherein the drive surface of the presser foot has an area corresponding to the area of the upper surface of the component.

3. The tool of claim 1 wherein the side plates are rigid, and one of the side plates is mounted to the base in a manner permitting separation of the side plates for reversal of the presser foot and engagement of the hooks.

4. In a tool for inserting an electronic component into and removing an electronic component from a socket on a circuit board: a base, a pair of side plates depending from opposite sides of the base, inwardly facing hooks at the lower ends of the side plates for selective engagement with an under surface of either the component or the socket, a drive screw threadedly mounted in the base, and a reversible presser foot slidably mounted between the side plates and adapted to be driven in a downward direction away from the base by the drive screw, said presser foot having a surface on one side thereof for engagement with an upper surface of the component and a pair of feet on an opposite side thereof for engagement with an upper surface of the circuit board.

5. The tool of claim 4 wherein one of the side plates is slidably mounted on pins extending laterally from one side of the base, with springs disposed coaxially about the pins urging the plate away from the base and a thumbscrew for moving the plate toward the base against the urging of the springs.

* * * * *